(12) United States Patent
Van Norman et al.

(10) Patent No.: US 9,643,159 B2
(45) Date of Patent: May 9, 2017

(54) CATALYST SUPPORT STRUCTURE, CATALYST INCLUDING THE STRUCTURE, REACTOR INCLUDING A CATALYST, AND METHODS OF FORMING SAME

(71) Applicant: THE REGENTS OF THE UNIVERSITY OF COLORADO; A Body Corporate, Denver, CO (US)

(72) Inventors: Staci A. Van Norman, Broomfield, CO (US); Victoria J. Aston, Boulder, CO (US); Alan W. Weimer, Niwot, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 14/436,433

(22) PCT Filed: Sep. 26, 2013

(86) PCT No.: PCT/US2013/062046
§ 371 (c)(1),
(2) Date: Apr. 16, 2015

(87) PCT Pub. No.: WO2014/062359
PCT Pub. Date: Apr. 24, 2014

(65) Prior Publication Data
US 2015/0290623 A1    Oct. 15, 2015

Related U.S. Application Data

(60) Provisional application No. 61/714,660, filed on Oct. 16, 2012.

(51) Int. Cl.
*A01B 11/00* (2006.01)
*B01J 23/30* (2006.01)
(Continued)

(52) U.S. Cl.
CPC ........... *B01J 23/30* (2013.01); *B01J 19/0093* (2013.01); *B01J 23/22* (2013.01); *B01J 23/34* (2013.01);
(Continued)

(58) Field of Classification Search
None
See application file for complete search history.

(56) References Cited

U.S. PATENT DOCUMENTS

| | | |
|---|---|---|
| 4,325,843 A | 4/1982 | Slaugh et al. |
| 6,479,902 B1 | 11/2002 | Lopatin et al. |
| 2006/0125099 A1 | 6/2006 | Gordon et al. |

OTHER PUBLICATIONS

Wilson, C.A. et al., Tungsten Atomic Layer Deposition on Polymers, Thin Solid Films 516, Apr. 28, 2007, pp. 6175-6185, University of Colorado, Boulder, CO.
(Continued)

*Primary Examiner* — Melvin C Mayes
*Assistant Examiner* — Kenneth Vaden
(74) *Attorney, Agent, or Firm* — Snell & Wilmer L.L.P.

(57) ABSTRACT

Structures, catalysts, and reactors suitable for use for a variety of applications, including gas-to-liquid and coal-to-liquid processes and methods of forming the structures, catalysts, and reactors are disclosed. The catalyst material can be deposited onto an inner wall of a microtubular reactor and/or onto porous tungsten support structures using atomic layer deposition techniques.

16 Claims, 13 Drawing Sheets

(51) Int. Cl.
    B01J 23/888    (2006.01)
    B01J 37/02     (2006.01)
    B01J 37/34     (2006.01)
    B01J 23/22     (2006.01)
    B01J 23/34     (2006.01)
    B01J 23/44     (2006.01)
    B01J 23/46     (2006.01)
    B01J 23/652    (2006.01)
    B01J 23/745    (2006.01)
    B01J 23/75     (2006.01)
    B01J 23/755    (2006.01)
    B01J 23/89     (2006.01)
    B01J 35/00     (2006.01)
    B01J 19/00     (2006.01)
    C10G 2/00      (2006.01)
    B01J 31/06     (2006.01)
    B01J 37/08     (2006.01)
    C23C 16/455    (2006.01)

(52) U.S. Cl.
    CPC ............. *B01J 23/44* (2013.01); *B01J 23/462* (2013.01); *B01J 23/464* (2013.01); *B01J 23/466* (2013.01); *B01J 23/6527* (2013.01); *B01J 23/745* (2013.01); *B01J 23/75* (2013.01); *B01J 23/755* (2013.01); *B01J 23/888* (2013.01); *B01J 23/892* (2013.01); *B01J 23/8993* (2013.01); *B01J 31/06* (2013.01); *B01J 35/006* (2013.01); *B01J 37/0225* (2013.01); *B01J 37/0244* (2013.01); *B01J 37/08* (2013.01); *B01J 37/349* (2013.01); *C10G 2/332* (2013.01); *C10G 2/333* (2013.01); *C10G 2/341* (2013.01); *C23C 16/45555* (2013.01); *B01J 2219/0086* (2013.01); *B01J 2219/00792* (2013.01); *B01J 2219/00822* (2013.01); *B01J 2219/00835* (2013.01); *B01J 2219/00873* (2013.01)

(56) References Cited

OTHER PUBLICATIONS

WIPO; International Search Report and Written Opinion mailed Aug. 18, 2014 in International Application No. PCT/US2013/062046.

WIPO; International Preliminary Report on Patentability and Written Opinion mailed Apr. 21, 2015 in International Application No. PCT/US2013/062046.

US 9,643,159 B2

CATALYST SUPPORT STRUCTURE, CATALYST INCLUDING THE STRUCTURE, REACTOR INCLUDING A CATALYST, AND METHODS OF FORMING SAME

CROSS REFERENCE TO RELATED APPLICATIONS

This application is the national stage entry of International Application No. PCT/US13/062046, entitled CATALYST SUPPORT STRUCTURE, CATALYST INCLUDING THE STRUCTURE, REACTOR INCLUDING A CATALYST, AND METHODS OF FORMING SAME, filed on Sep. 26, 2013, and claims the benefit of U.S. Provisional Patent Application Ser. No. 61/714,660, entitled CATALYST SUPPORT STRUCTURE, CATALYST INCLUDING THE STRUCTURE, AND REACTOR INCLUDING SAME, and filed Oct. 16, 2012, the disclosures of which are incorporated herein by reference to the extent such disclosures do not conflict with the present disclosure.

STATEMENT REGARDING FEDERALLY SPONSORED RESEARCH OR DEVELOPMENT

This invention was made with government support under grant number DE-AR0000291 awarded by the U.S. Department of Energy. The U.S. government has certain rights in the invention.

FIELD OF DISCLOSURE

The present invention generally relates to catalysts, catalyst support structures, and reactors including a catalyst. More particularly, the invention relates to catalyst support structures formed using sacrificial material, to catalyst structures includes the catalyst support structures, to reactors including catalyst material, and to methods of forming the same.

BACKGROUND OF THE DISCLOSURE

Catalysts and reactors including catalysts can be used for a variety of purposes. For example, catalysts can be used to lower a temperature required for a reaction to take place, to increase a reaction rate at a temperature, and/or to drive particular reactions relative to other reactions that might otherwise be favored in the absence of a catalyst.

Catalysts are often employed in gas-to-liquid (GTL) and coal-to-liquid (CTL) reactions to form liquid hydrocarbons from natural gas (GTL) or coal (CTL). In these cases, a carbon source, such as natural gas or coal is exposed to an oxidation or gasification process to produce synthesis gas (syngas), including hydrogen and carbon monoxide. Fischer Tropsch reactions (collectively called Fischer Tropsch process), using a suitable catalyst, can convert the hydrogen and carbon monoxide to products, such as synthetic oils and fuels. The products formed using a Fischer Tropsch process may be desirable because the products can have a relatively high energy density, may be relatively pure, and can be easily transported.

Liquid fuels can be produced from a Fischer Tropsch process on catalytic surfaces at pressures around 2-4 MPa and moderate temperature of about 200° C.-240° C. Primary reaction products are typically straight chain paraffin's and tight control of reactor conditions can increase this product fraction and improve reactor productivity. However, a Fischer Tropsch process is highly exothermic with a heat of reaction of about −157 kJ/mol and up to −247 kJ/mol for $CH_4$ production, making temperature control difficult in most conventional reactors. Thermal gradients provide additional control difficulties. As reactor temperatures increase for a Fischer Tropsch process, selectivity favors formation of $CH_4$, which, in turn, causes more heat to be released and may result in thermal instabilities and a "runaway" reaction. The Fischer Tropsch process research community has worked to understand and improve Fischer Tropsch process catalyst activity and selectivity. However, at an industrial scale, temperature control is a primary concern. In the last ten years, new microstructured reactors and monolithic structures have been proposed for application in a Fischer Tropsch process and have shown promise in addressing this major challenge. But in practice, such complex designs have been impractical for industrial scale [1-3]. Accordingly, improved catalysts, catalyst structures, and reactors, which may be used for a Fischer Tropsch process or other applications, and methods of forming the catalysts, catalyst structures, and reactors, are desired.

SUMMARY OF THE DISCLOSURE

Various embodiments of the disclosure relate to catalyst structures, catalysts including the structures, and to reactors including catalyst material. While the ways in which the various embodiments of the disclosure address the drawbacks of the prior art structures, catalysts, reactors, and methods are discussed in greater detail below, in general, the structures, catalysts, reactors, and methods in accordance with exemplary embodiments of this disclosure employ atomic layer deposition of tungsten to provide a catalyst support with desired properties.

In accordance with exemplary embodiments of the disclosure, a method of forming a tungsten support structure includes the steps of providing a polymer support structure, depositing tungsten overlying the polymer support structure using atomic layer deposition, and (optionally) exposing the polymer support structure to a calcination process to remove the polymer support structure or other nitrogen environment to thereby form the tungsten support structure comprising tungsten nitride ($WN_x$)—e.g., the surface of the tungsten layer may be terminated with nitrogen or nitrogen groups. The tungsten nitride is thought to facilitate formation or deposition of subsequent material, such as metals typically used as catalysts. In accordance with various aspects of these embodiments, the tungsten is deposited directly onto the polymer support structure. In accordance with other aspects, an oxide, such as a metal oxide (e.g., aluminum oxide) is deposited onto the polymer support structure and the tungsten is deposited onto the oxide. In accordance with yet further aspects, the optional step of exposing the polymer support structure to a calcination process includes exposing the polymer support to an ammonia reactant.

In accordance with additional exemplary embodiments of the disclosure, a method of forming a catalyst structure includes the steps of providing a polymer support structure, depositing tungsten overlying the polymer support structure using atomic layer deposition, (optionally) exposing the polymer support structure to a calcination process to remove the polymer support structure or other nitrogen environment to thereby form the tungsten support structure comprising $WN_x$, and depositing a catalyst, such as one or more metals selected from the group consisting of Co, Ni, NiPt, Rh, Ru, Pd, Os, V, Fe, and Mn, e.g., using atomic layer deposition, onto the tungsten support. In accordance with various aspects of these embodiments, the optional step of exposing the polymer support structure to a calcination process includes exposing the polymer support structure to an ammonia reactant. In accordance with further aspects of these embodiments, the tungsten is deposited directly onto the polymer support structure, or in accordance with other aspects, an oxide, such as a metal oxide (e.g., aluminum oxide) is deposited onto the polymer support structure and the tungsten is deposited onto the oxide. In accordance with yet additional embodiments of the disclosure, a microtubular reactor (MTR) system includes one or more microtubular reactors, wherein each microtube includes an interior wall, wherein tungsten is deposited onto the interior wall using atomic layer deposition, and wherein a catalyst, such as a metal selected from the group consisting of Co, Ni, NiPt, Rh, Ru, Pd, Os, V, Fe, and Mn is deposited onto the tungsten using atomic layer deposition. In accordance with various aspects of these embodiments, the tungsten and/or catalyst is deposited using in-situ atomic layer deposition. The tungsten and/or catalyst may be deposited as one or more continuous layers or as incomplete layers, such that, for examples, a plurality of islands of catalyst material (e.g., having an average diameter of about 1 nm to about 20 nm, about 10 nm to about 20 nm, or about 2 to about 10 nm) forms on the interior surface of the wall.

In accordance with yet additional exemplary embodiments of the disclosure, a microtubular reactor includes one or more reactor tubes, each tube having an inner wall and an outer wall, and a catalytic structure chemically bonded to the inner wall, wherein the catalytic structure comprises tungsten and optionally a catalyst—e.g., one or more metals selected from the group consisting of Co, Ni, NiPt, Rh, Ru, Pd, Os, V, Fe, and Mn. The tungsten and optionally catalyst may be deposited using atomic layer deposition, such as in-situ atomic layer deposition. The catalyst structure may additionally include an oxide, such as aluminum oxide, adjacent the tungsten. In accordance with various aspects of these embodiments, the catalytic structure is formed by depositing tungsten onto polymer support structures attached to the inner wall and optionally removing the polymer support structures—e.g., using an ammonia calcination process.

In accordance with yet further exemplary embodiments of the disclosure, a method of forming a microtubular reactor includes the steps of providing one or more reactor tubes, providing sacrificial polymer material on an interior surface of the one or more reactor tubes (or providing one or more reactor tubes with the sacrificial polymer material attached to an inner wall of the one or more reactor tubes), depositing tungsten onto the sacrificial polymer material, optionally removing the sacrificial polymer material to form porous tungsten on the interior surface, and depositing a catalyst, such as one or more metals selected from the group consisting of Co, Ni, NiPt, Rh, Ru, Pd, Os, V, Fe, and Mn, onto the porous tungsten. In accordance with various aspects of these embodiments, the step of optionally removing the sacrificial polymer material includes exposing the polymer support structure to an ammonia or other suitable reactant—e.g., to form tungsten nitride. In accordance with various aspects of these embodiments, the tungsten is deposited directly onto the polymer support structure; in accordance with other aspects, an oxide, such as a metal oxide (e.g., aluminum oxide) is deposited onto the polymer support structure and the tungsten is deposited onto the oxide.

In accordance with additional exemplary embodiments of the disclosure, a method of forming a microtubular reactor includes the steps of providing one or more reactor tubes, packing sacrificial polymer material into an interior of the one or more reactor tubes (or providing one or more reactor tubes packed with sacrificial polymer material), depositing tungsten onto the sacrificial polymer material, optionally removing the sacrificial polymer material to form porous tungsten on the interior surface (e.g., using an ammonia calcination process), and depositing a catalyst—e.g., including one or more metals selected from the group consisting of Co, Ni, NiPt, Rh, Ru, Pd, Os, V, Fe, and Mn onto the porous tungsten. In accordance with various aspects of these embodiments, the tungsten is deposited directly onto the polymer support structure using atomic layer deposition; in accordance with other aspects, an oxide, such as a metal oxide (e.g., aluminum oxide) is deposited onto the polymer support structure using atomic layer deposition and the tungsten is deposited onto the oxide using atomic layer deposition. In accordance with further aspects, tungsten nitride may be formed on the surface of the tungsten.

BRIEF DESCRIPTION OF THE DRAWING FIGURES

A more complete understanding of exemplary embodiments of the present disclosure may be derived by referring to the detailed description and claims when considered in connection with the following illustrative figures.

Figure 11A:
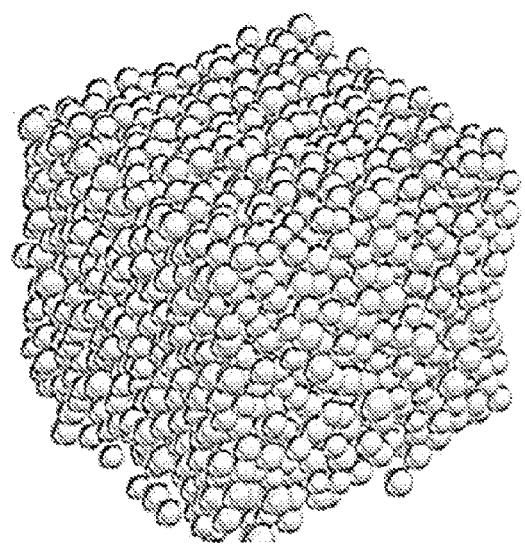
Figure 11B:
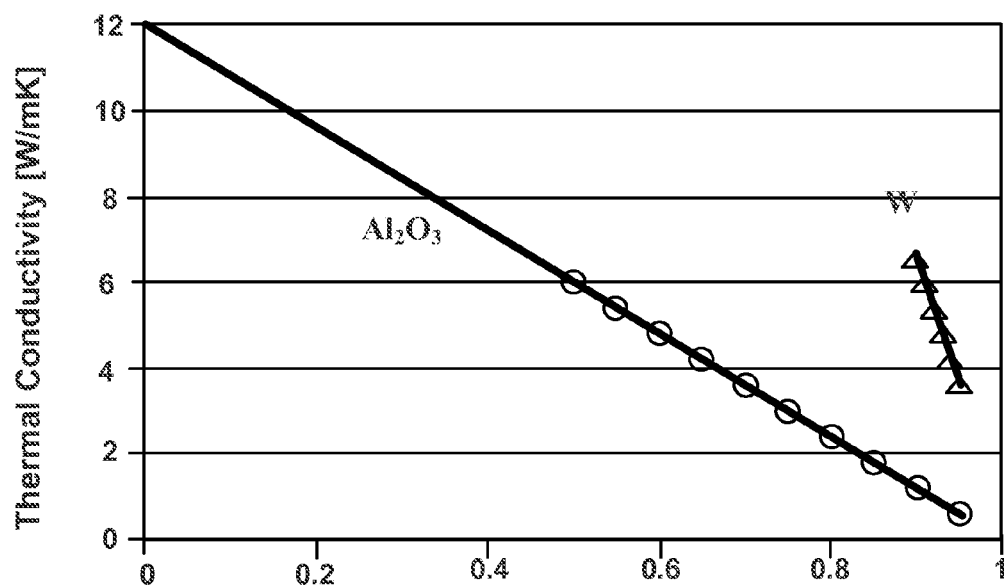

FIGS. 11(a) and 11(b) illustrate a randomly packed particle bed and effective thermal conductivity of W particles.

Figure 12:
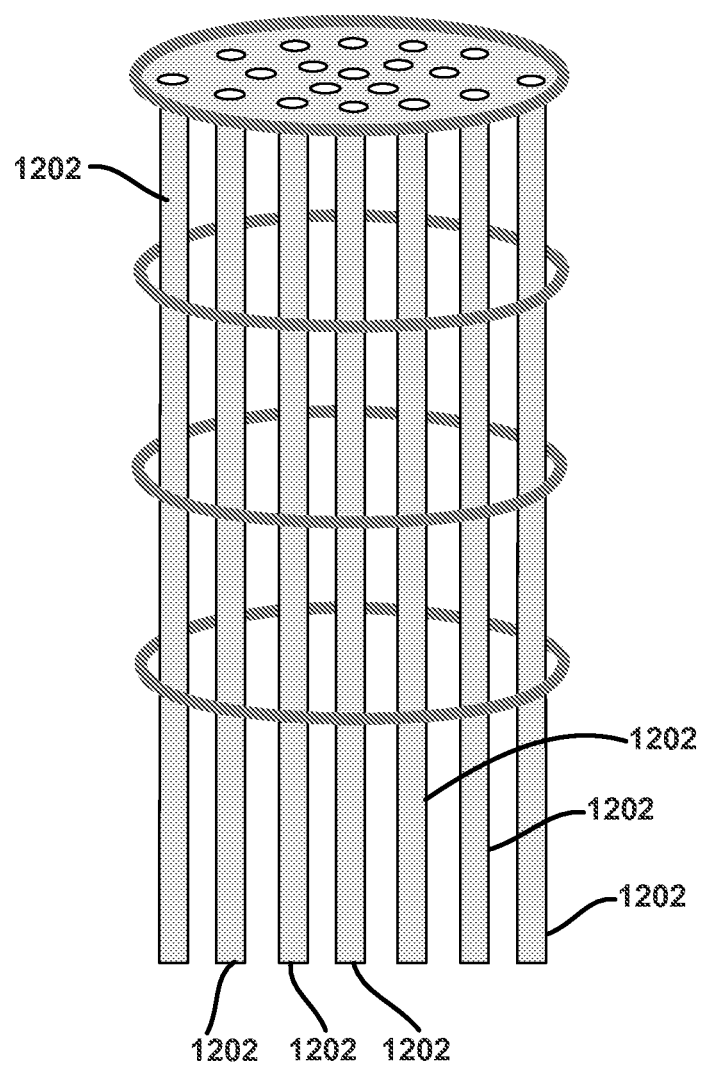

FIG. 12 illustrates a system, including a plurality of microtubular reactors, in accordance with yet further exemplary embodiments of the disclosure.

Figure 13:
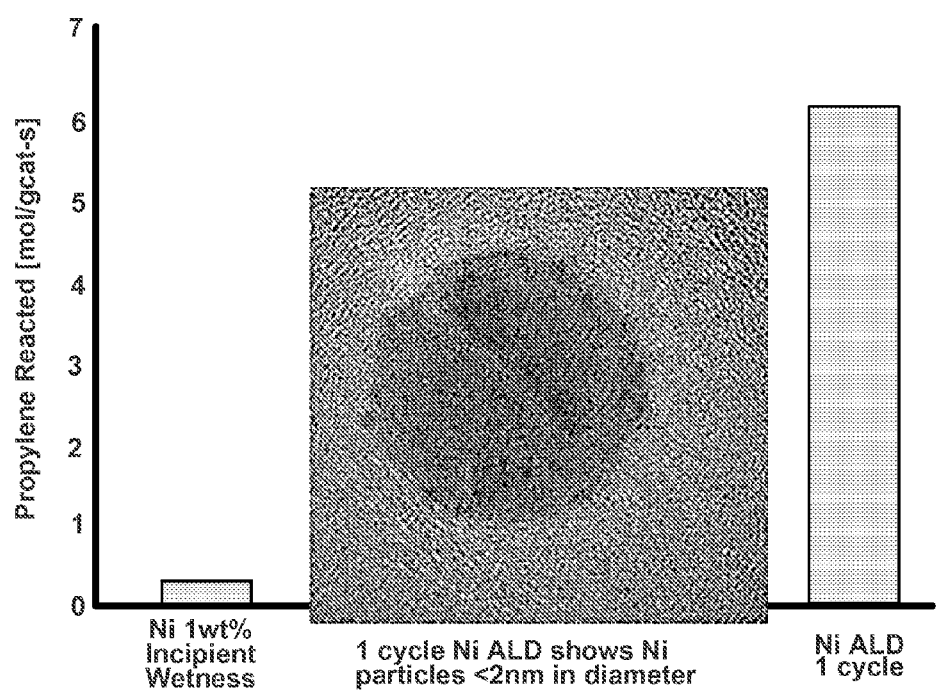

FIG. 13 illustrates a depiction of the activity for the hydrogenation of propylene, which compares a Ni catalyst produced via incipient wetness (1.0 wt %) to that produced using ALD (0.6 wt %).

Figure 14:
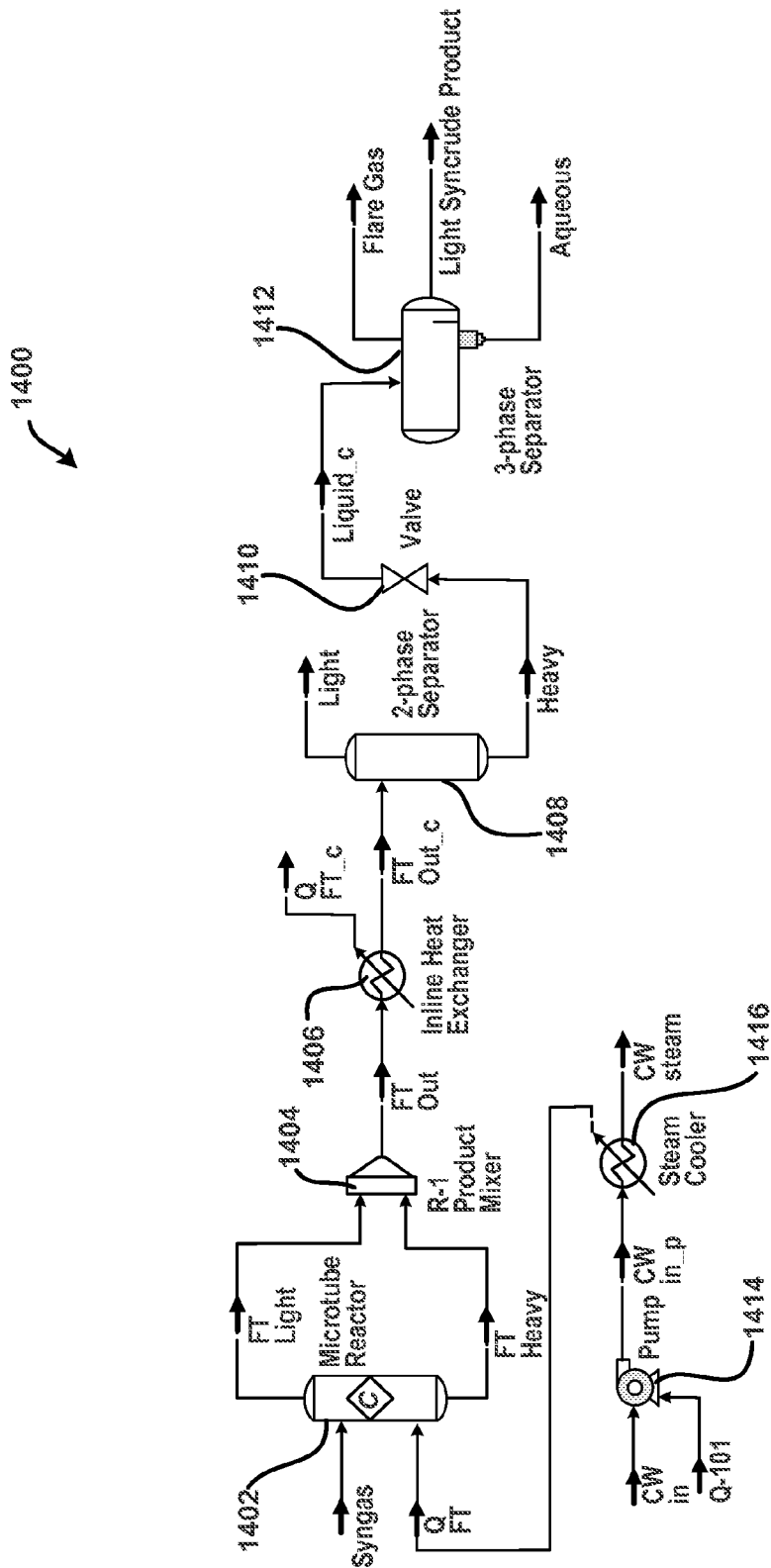

FIG. 14 illustrates a system for forming light syncrude products in accordance with further exemplary embodiments of the invention.

Figure 15:
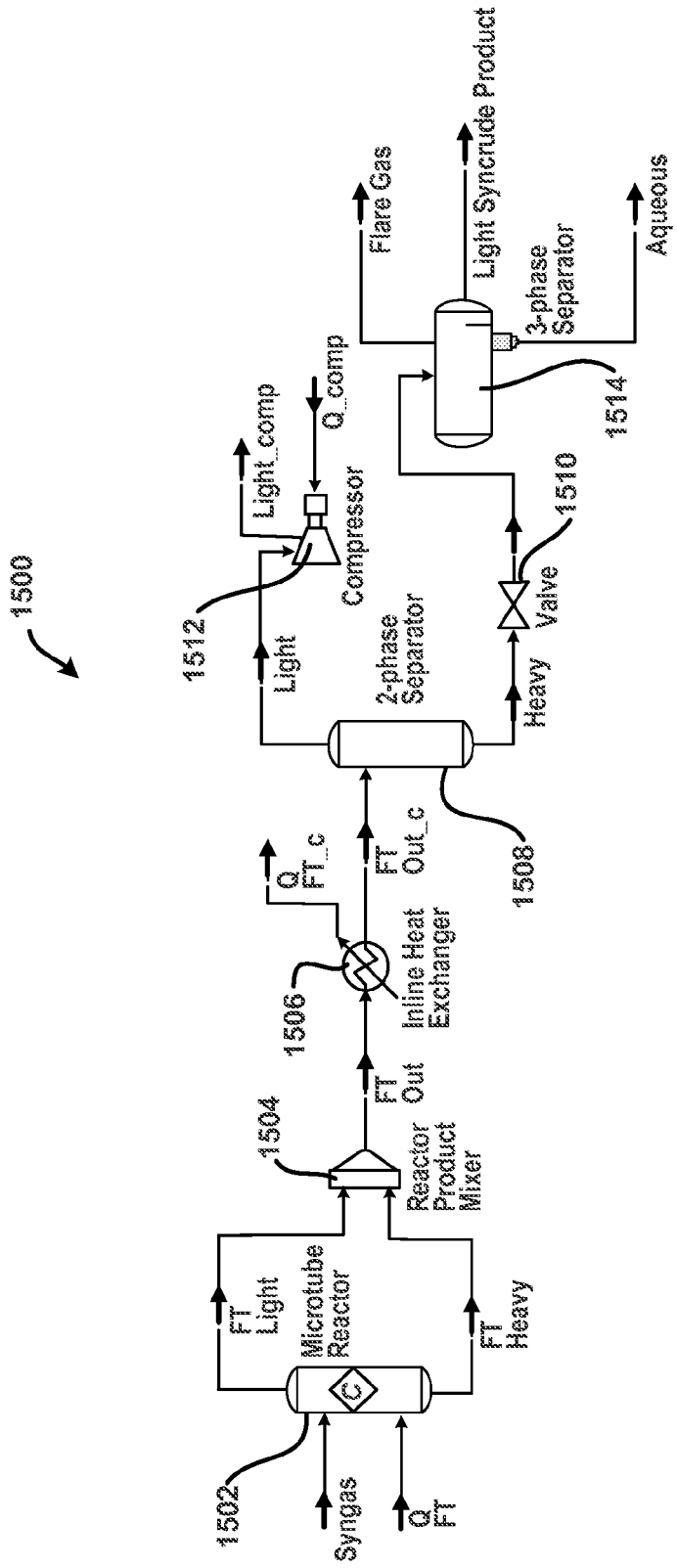

FIG. 15 illustrates another system for forming light syncrude products in accordance with exemplary embodiments of the invention.

It will be appreciated that the figures are not necessarily drawn to scale. For example, the dimensions of some of the elements in the figures may be exaggerated relative to other elements to help to improve understanding of illustrated embodiments of the present invention.

DETAILED DESCRIPTION OF PREFERRED EMBODIMENTS OF THE INVENTION

The description of exemplary embodiments of the present invention provided below is merely exemplary and is intended for purposes of illustration only; the following description is not intended to limit the scope of the invention disclosed herein. Moreover, recitation of multiple embodiments having stated features is not intended to exclude other embodiments having additional features or other embodiments incorporating different combinations of the stated features.

The present disclosure provides structures, catalysts, reactors including a catalyst, and methods of forming and using the structures, catalysts, and reactors. The structures, catalysts, and reactors may be used in a variety of applications and are conveniently described below in connection with a Fischer Tropsch process. However, the invention is not so limited. As set forth in more detail below, exemplary structures, catalysts, and reactors described herein may exhibit better heat transfer compared to conventional structures, catalysts, and reactors, be easier to manufacture, and/or use less catalyst material to achieve desired products.

Figure 1:
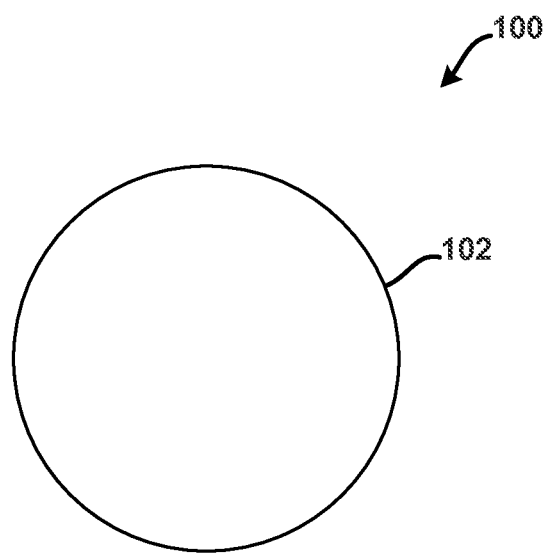
FIG. 1 illustrates a tungsten support structure in accordance with exemplary embodiments of the disclosure.

FIG. 1 illustrates a tungsten support structure 100 that is formed in accordance with various embodiments of the disclosure. In the illustrated example, support structure 100 includes a thin wall of tungsten material 102 about a perimeter and a generally hollow interior. Although illustrated as a solitary configuration, as set forth in more detail below, support structures are not so limited, and may include a variety of configurations and substructures. For example, the structure may contain both interconnected mesoporous and/or macroporous structures, which could have enhanced properties compared to single-size pore materials.

Figure 2:
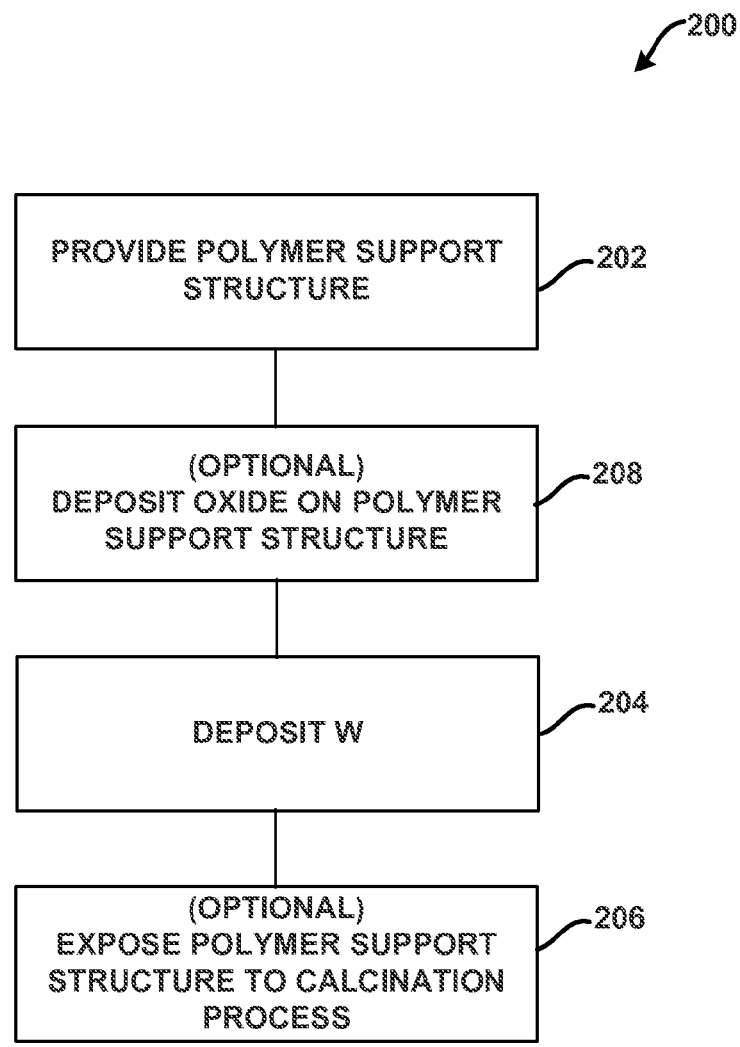
FIG. 2 illustrates a method of forming support structures in accordance with exemplary embodiments of the disclosure.

FIG. 2 illustrates a method 200 of forming support structure, such as structure 100. Method 200 includes the steps of providing a polymer support structure (step 202), depositing tungsten overlying the polymer support structure using atomic layer deposition (step 204), and optionally exposing the polymer support structure to a calcination process to remove the polymer support structure (step 206).

Step 202 includes providing a sacrificial substrate or support structure that is used as a template for subsequently deposited tungsten. The sacrificial support structure may be formed from a variety of materials, such as polymers or silica gel. Exemplary polymers suitable for use as a sacrificial substrate include resins, such as DOWEX™ PE-RT resins, available from the Dow Chemical company, Amberchrom™ particles available from Rohm and Haas Company, SuperQ particles available from Sigma-Alrdich, highly porous poly(styrene-divinylbenzene) (PS-DVB) particles, particularly those available as Cavilink™, and other high internal phase emulsion, HIPE, polymers formed by suspension or solution polymerization, and may be in a variety of forms, such as particles. In accordance with various aspects of these embodiments, step 202 includes providing a plurality of sacrificial polymer particles that constitute the sacrificial substrate. Although the term sacrificial is used to refer to the substrate/template material, the material need not necessarily be removed in all instances.

During step 204, tungsten is deposited onto the support structure(s) using atomic layer deposition (ALD). ALD enables precise deposition of ultra-thin, highly conformal coatings over complex 3D topography structures (e.g., the sacrificial structure(s)), with excellent control over stoichiometry and properties, and allows deposition of the tungsten onto the polymer structures without substantially changing the configuration of the structures. The films grown by ALD are inherently controlled by self-limiting sequential surface chemical reactions, so precursors are used efficiently.

A two-step reaction of $Si_2H_6$ and $WF_6$ forms metallic W, which deposits at a consistent growth rate of about 0.05 nm/cycle after an initiation period of 4-10 cycles on $Al_2O_3$ hydroxyl surfaces. By way of example, W ALD was carried out on polymer surfaces at 80° C. on flat polymer films and particles. The low temperature reaction is desirable for structural integrity of the polymers, which changes once/if softening temperatures are reached. The absence or limited existence of surface functional groups, such as —OH or —$NH_2$ on native polymer surfaces is noted as a hindrance to nucleation of W growth on polymers. In fact, growth of W on native polymers may take more than 50 ALD cycles for a measurable W growth. However, when as few as 5 ALD cycles of $Al_2O_3$, using trimethylaluminum (TMA) and water, is deposited prior to W ALD initiation, W growth is measured within the first 25 ALD cycles. The mechanism of growth may be explained by the similar chemistry of the TMA methyl groups and polymers initiating —OH functional sites for nucleation of W ALD. As few as two cycles of W has also been found to be sufficient. In accordance with various examples, about 20 to about 200 cycles or about 50 to about 100 cycles of W are deposited onto a substrate.

It should also be noted that deposition by ALD on high surface area substrates substantially reduces and, for the case of particle ALD, may virtually eliminate any waste of precursors. The "near zero waste" of potentially expensive precursor is a major driver for ALD being a low cost process for placing nearly perfect ultra-thin films on high surface area supports. The fact that ALD is independent of line-of-sight and can coat internal pores just as easily as external surfaces with atomic level control contributes to high quality deposition throughout the substrate material—maintaining substrate structure and not filling in and closing off pores.

During optional step 206, the polymer support structure (now coated with tungsten) is exposed to a calcination process to remove the polymer support structure, leaving a tungsten structure that may substantially mimic the polymer support structure. In accordance with exemplary aspects of these embodiments, the calcination process includes exposing the polymer support structure to an ammonia, hydrogen, or oxygen environment. For example, the calcination process may occur at a pressure of about 1 Torr to about 600 psi, having a partial pressure of oxygen of about twenty percent at a temperature of about 200° C. to about 1000° C.

As illustrated, method 200 includes an optional step of depositing an oxide, such as aluminum oxide onto a surface of the polymer support structure. For example 1 to about 10 or about 2 to about 5 ALD layers or cycles of oxide may be deposited onto the polymer support structures prior to depositing the tungsten.

Figure 3:
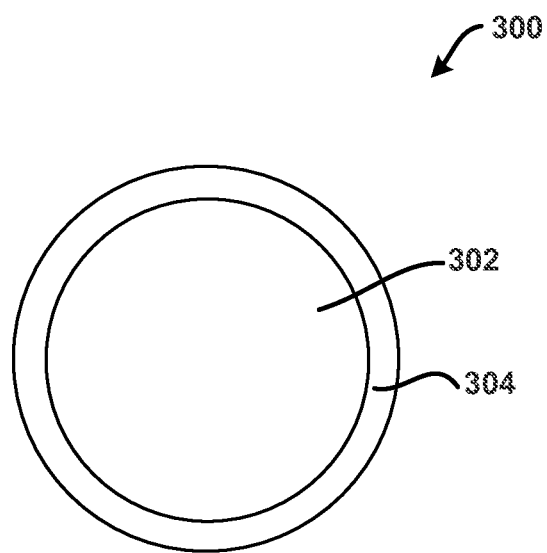
FIG. 3 illustrates a catalyst structure in accordance with additional exemplary embodiments of the disclosure.

FIG. 3 illustrates a catalyst structure 300 in accordance with additional exemplary embodiments of the disclosure. Structure 300 is similar to structure 100, except structure 300 includes a tungsten layer 302 and a catalyst layer 304 overlying tungsten layer 302. Similar to structure 100, although structure 300 is illustrated as a singular sphere, structure 300 may include a more complex structure, such as a structure having mesoporous and/or macroporous structures and/or a structure used in pack bed or coated-wall reactors, as described in more detail below.

Figure 4:
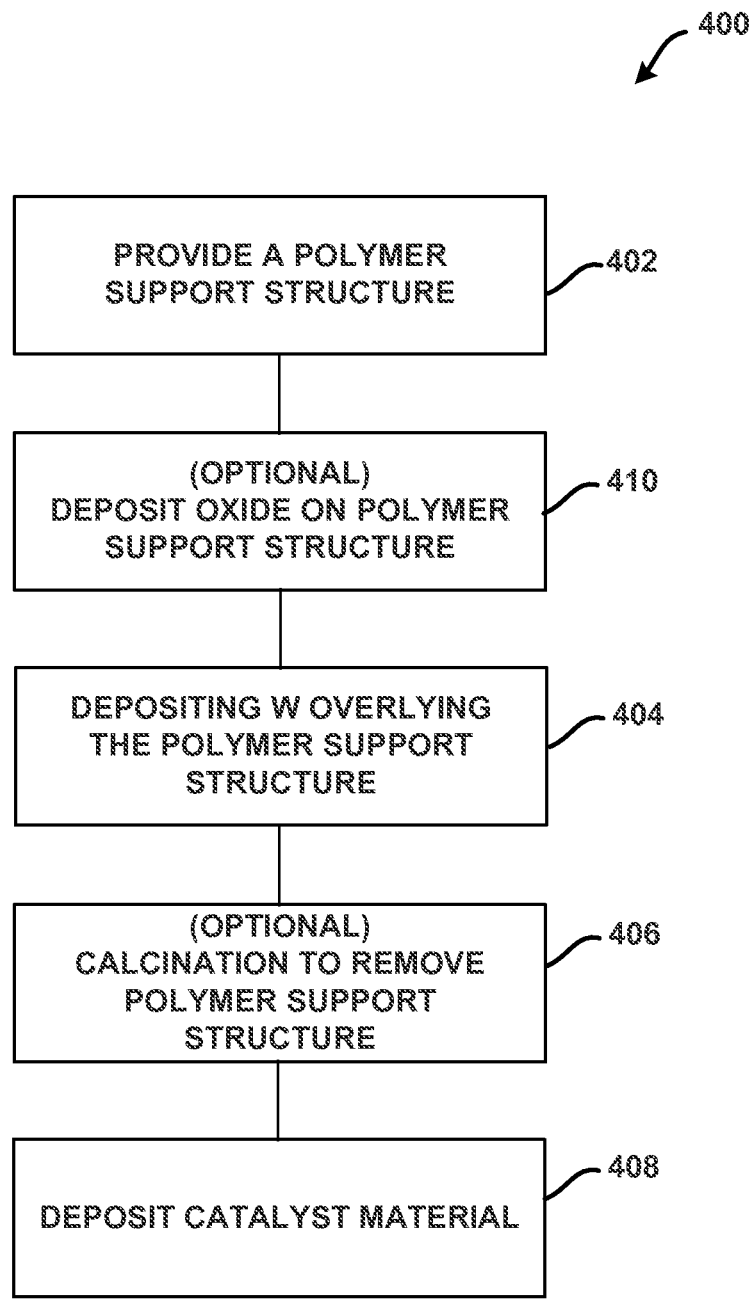
FIG. 4 illustrates a method of forming a catalyst structure in accordance with additional exemplary embodiments of the disclosure.

FIG. 4 illustrates a method 400 of forming a catalyst structure, such as the structure illustrated in FIG. 3 or similar structure. Method 400 includes the steps of providing a polymer support structure (step 402), depositing tungsten overlying the polymer support structure using, e.g., atomic layer deposition (step 404), optionally exposing the polymer support structure to a calcination process to remove the polymer support structure and /or otherwise form tungsten nitride (step 406), and depositing catalyst material, such as one or more metals selected from the group consisting of Co, Ni, NiPt, Rh, Ru, Pd, Os, V, Fe, and Mn, using atomic layer deposition onto the tungsten support (step 408).

Steps 402-406 and 410 may be the same or similar to steps 202-206 and 208 described above in connection with FIG. 2. Method 400 includes the additional step 408 of depositing catalyst material onto the tungsten support. A number of layers of catalyst material may vary according to a variety of factors. However, less than five cycles or about 2 cycles of ALD processing has been found to be sufficient. By way of example, cobalt catalyst material can be deposited onto the tungsten using cobaltocene (bis(cyclopentadienyl)cobalt) and $NH_3$ in an ALD process.

It is expected that the ALD deposition of a catalyst, such as metallic Co, will produce a highly active and stable catalyst with a relatively long lifetime and decreased deactivation for a Fisher Tropsch process and other reactions. Because the ALD catalyst is chemically adhered to the support, the deposited material has been shown to be extremely stable. Thus, an advantage of the illustrated method is producing a highly active catalyst with minimal use of precious metals.

The application of, e.g., a Co catalyst by a metallic ALD technique using cobaltocene as a precursor, has multiple advantages. First, the use of cobaltocene as a reactant is a much less expensive route than other proposed chemistries for metallic Co deposition. Second, the deposition of a metallic Co by ALD will be more stable than, for example, Co deposited using an incipient wetness deposition for sintering because, once deposited, the catalyst does not need to be taken to high temperature for reduction and is chemically bonded to the surface. Third, the deposition of a metallic Co using cobaltocene compared to a cobalt oxide by ALD results in more complete use of the precious metal because the material does not have to be reduced.

Typically, the cost of an ALD precursor is more than that of the common liquid phase precursor that is used for commercial catalyst manufacture (chloroplatinic acid, metal nitrates, etc.). This cost disadvantage can be compensated by the inherent value in improved performance benefits normally attributable to nanoscale features (e.g., higher activity, better selectivity). These benefits are measured by the catalyst users relative to standard catalysts produced using incumbent technologies. However, the design and control freedom using this scheme is what may be what is most compelling to catalyst manufacturers, as the ultra-high dispersion, ultra-low loadings, and opportunity to sparingly decorate existing catalysts with secondary promoter elements, provides product differentiation and the ability to reduce noble metal loadings while maintaining desired performance.

Figure 5:
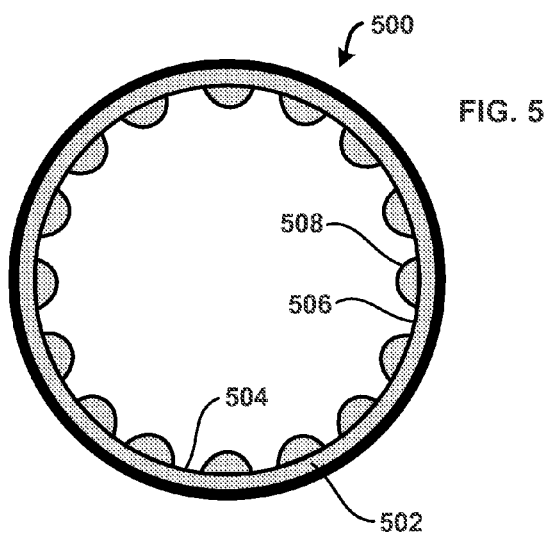
FIGS. 5-7 illustrates microtubular reactors in accordance with various exemplary embodiments of the disclosure.
Figure 6:
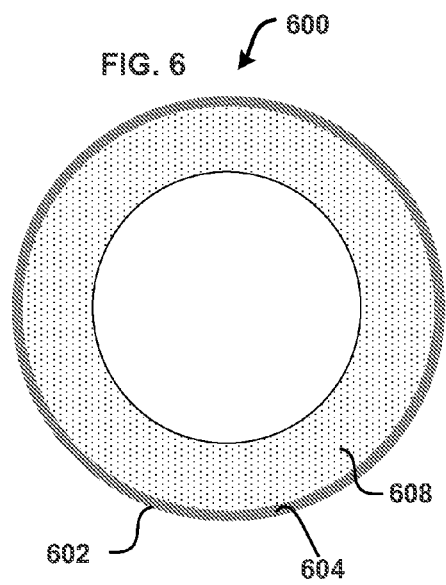
Figure 7:
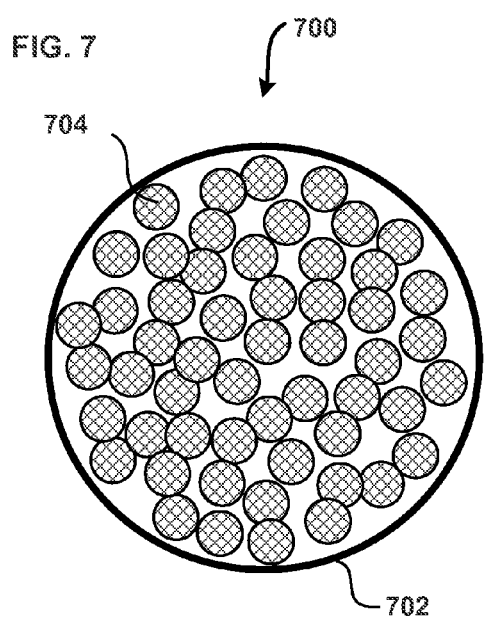

Turning now to FIGS. 5-7, exemplary microtubular reactors 500, 600, and 700, in accordance with exemplary embodiments of the disclosure are illustrated. The illustrated reactors are suitable for a variety of applications, including a low cost alternative to microreactor manufacturing technology for application in, e.g., gas-to-liquid (GTL)/coal-to-liquid CTL reactions, specifically Fischer Tropsch process reactions. The three exemplary reactor tube types discussed in detail below include a catalyst deposited on tube walls only, a packed bed, and a wall coating of porous W fabricated by ALD on sacrificial porous polymer structures followed by (optional) removal of the polymer and deposition of catalyst. Use of W is advantageous over other compounds, such as $Al_2O_3$, because the bulk thermal conductivity of W is over five times greater than that of $Al_2O_3$. As discussed in more detail below, exemplary reactor designs combine in-situ fabrication of supports and catalysts—e.g., the catalysts and structures described above—using ALD within microtubes.

Exemplary reactor tubes described herein provide (1) high surface-to-volume ratios that improve heat removal from reactions (e.g., Fischer Tropsch reactions) producing isothermal conditions; (2) improved control of reactor temperature that diminish opportunity for reactor thermal runaway; (3) methane production minimization that is possible due to removing reactor thermal gradients making it advantageous to operate at high CO conversion resulting in higher productivity to liquid fuels; (4) selectivity to a smaller range of fuel products produced from Fischer Tropsch reactions that is possible with increased temperature controllability; (5) metallic catalyst deposition by ALD that increases the utilizable catalytic surface, decreasing the precious metal loadings needed for high productivity; (6) overall efficiency of GTL/CTL feedstock to fuel processes by directly producing more liquid fuel from reactor inlet flows. Manufacturing cost decreases for the conceptualized reactor over state-of-the-art microreactors are supported by the following hypotheses: (7) all fabrication steps may be gas or liquid phase within microtubes which reduces equipment needed; and (8) scale-up to pilot-plant or commercial production may be achievable by increasing the number of microtubes in the multi microtubular heat exchange reactor. Each consecutive design illustrated in FIG. 5-7 increases available surface area for reaction within the same reactor volume. However with each increase in the amount of porous W within the microtube, the heat transport distance from the exothermic reaction location to the reactor wall is increased. This balance between available surface area and heat transport may determine optimal reactor design. At the macro scale, the reactor design contains multiple microtubes, having diameters ranging from, for example, about 0.508 mm to about 2.54 mm inner diameter. The scale-up of a multitubular reactor can be easily designed for pilot plant to commercial scale.

As noted above, the reactors described herein are suitable for Fischer Tropsch process reactions. There are two general types of Fischer Tropsch process reactions, high temperature (300-350° C.) and low-temperature (200-240° C.). This disclosure focuses on low-temperature reaction processing; however, the invention is not necessarily limited to the low-temperature reaction processing. Multiple reaction products are produced from low-temperature Fischer Tropsch reactions including olefins, alcohols and some branched molecules. However, the primary products are straight chain paraffin's that range from $CH_4$ to high molecular weight waxes. The product distribution can be characterized by the single value α which is a modified chain growth probability model developed by Iglesia et al. in 1993, also known as the Exxon model [7]. The generalized Fischer Tropsch reactions for the major products of a Fischer Tropsch process are shown in Equation 1. Oxygen is removed as water and is then available for a secondary reaction, i.e., water gas shift (WGS), which is shown in Equation 2. However, the WGS reaction can be controlled by selection of catalyst. Cobalt (Co) has no WGS activity whereas iron (Fe) does. The WGS reaction is important for FTS because the molar $H_2/CO$ ratio changes if the system is not in equilibrium and CO is converted to $CO_2$ which is not profitable and in most designs adds expensive carbon capture processing.

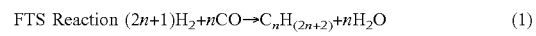

FTS Reaction $(2n+1)H_2 + nCO \rightarrow C_nH_{(2n+2)} + nH_2O$ (1)

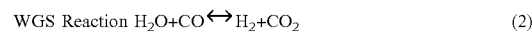

WGS Reaction $H_2O + CO \leftrightarrow H_2 + CO_2$ (2)

Catalyst supports may affect Fischer Tropsch processes reactions, particularly impacting heat and mass transport properties as a function of particle diameter. Modeling has shown that $Al_2O_3$ support particle diameters larger than 400 µm result in internal temperature gradients >1° C., and 1 mm particles have gradients >6° C. [9]. These thermal gradient conditions affect Fischer Tropsch process product selectivity and may be an origin for reactor runaway. It has also been determined that mass transport distances greater than 50-100 µm result in diffusional resistances that limit reaction productivity [10]. Pore diameter effects have been studied by many groups. In one particular 2002 study for $SiO_2$ with Co catalysts, an average pore diameter of 10 nm was found to produce the highest Fischer Tropsch process activity and optimal $C_{5+}$ selectivity with minimal $CH_4$ selectivity. The investigators concluded that this was due to an inability to form Co crystals within smaller pores. In their 2 nm pore sample, average crystal size was 20 nm—which can only form on the exterior of the particle. Their 10 nm pore sample produced Co crystals of 7.3 nm, which, again, correlates with other studies concerning Co particle size [11].

Extensive work on the effect of Co particle size has concluded that supported catalysts reach a maximum activity at an approximate size of 10 nm. As the particle size becomes smaller than 10 nm, there is less activity and more selectivity toward $CH_4$ [12-15].

The atomic controlled fabrication of a microstructured reactor as described herein is a major departure from standard packed bed and slurry bubble column reactor processing methods typically used for Fischer Tropsch processes. Additionally, the significant simplification of fabrication for the ALD-based microtubular reactor over current microchannel and monolithic reactor fabrication methods is disruptive. The simplified and lower-cost fabrication process provides for chemical reaction processing having equal or improved performance. A summary of comparative key process parameters of Fischer Tropsch reactions in the mentioned reactors is provided in Table 1. Additional benefits of exemplary reactors compared to packed bed, slurry bubble, monolithic, and microchannel reactors are provided below.

TABLE 1

Summary of comparative key FTS reaction characteristics

| | Parameter | | |
| --- | --- | --- | --- |
| Reactor | Thermal Gradient | Single-pass Conversion | Thermal Control |
| Packed Bed Reactor | Large | Medium | Poor |
| Slurry Bubble Column Reactor | Small | Low | Good |
| Monolithic Reactor | Small | Medium | Good |
| Microchannel Reactor | Small | High | Good |
| Microtubular Reactors of the present disclosure | Small | High | Good |

Benefits of Microtubular Reactor to Packed Bed Reactors

The increased surface-to-volume ratio in a microtube limits radial heat transport distance and decreases thermal gradients within the reactor. High production rates are indicative of flow reactors; however, the thermal gradients of a Fischer Tropsch process in commercial scale packed bed reactors result in broadened product distributions and poor economics. Microtube reactors as described herein exhibit beneficial high production rates and have limited thermal gradients to improve selectivity to high valued Fischer Tropsch process products.

Benefits of Microtubular Reactor Compared to a Slurry Bubble Column Reactor

The uniform temperature profiles characteristic of continuously stirred reactors like SBCRs produce much tighter product selectivity's, but also lower production rates due to reduced reactant concentrations. Because the microtube reactor is a flow reactor, it exhibits the high rates of reaction such as with PBRs, but also operates with limited thermal gradients. This combination provides for the optimal reactor conditions for exothermic reactions like Fischer Tropsch process reactions to produce high valued products.

Exemplary systems and methods disclosed herein involve the application of in-situ ALD fabrication of a reactor with improved thermal characteristics to obtain the optimal reaction conditions for the exothermic Fischer Tropsch reactions to promote CTL/GTL technologies to higher economic productivity. In stark comparison to other techniques to improve Fischer Tropsch reactor technology, exemplary reactors, systems and methods of the disclosure use simple gas and liquid phase processes to fabricate a reactor having highly controlled material characteristics. The expensive stacking of channels and slurry deposition of catalyst post-construction for conventional microchannel reactors is avoided. Support and catalyst deposition for exemplary reactors described herein is done in-situ with atomic level control.

Benefits of Microtubular Reactor to Monolithic Reactors

Monoliths are extruded metal structures normally of a honeycomb pattern of straight small diameter channels. The small channels promote laminar flow, which improves mass transport properties. Washcoating of thin catalyst layers are deposited onto the monolith walls. These structures are placed inside a reactor tube where the gap between the monolith and the reactor tube is then the major limiting factor to the system benefits. This gap changes with reactor conditions and the resistance to heat transport out of the system varies. This aspect limits the diameter of the overall system because of increasing resistance for thermal transport.

Microtubular reactors based on in-situ ALD fabrication have the catalytic structure chemically bonded to the tube wall, which means that there is no thermal resistance at the tube wall due to changing gap length. Furthermore, the simplified fabrication of gas and liquid phase processing all within the final reactor structure is advantageous over fabricating a metal structure, which must fit tightly within another tube.

Benefits of Microtubular Reactor to Microchannel Reactor

Recent studies of microchannel reactors for Fischer Tropsch reactions have shown large productivities as high as 7.1 g C2+/(g-Co h) at a single pass CO conversion of 90% and $CH_4$ selectivity of 3.4% [9]. However, the scale-up of the microchannel system and incorporation of catalyst into the systems have proven to be impractical or non-cost competitive for most industrial applications. U.S. Pat. Nos. 7,084, 180; 8,188,153 disclose microchannel technology for a Fischer Tropsch process that uses parallel reactor cores that house a catalyst that is either wash-coated within the channel or packed into the reactor channel and permanently bonded around. These microchannel reactors employ catalysts with standard metal oxide support materials and high Co loadings of 25 wt % or greater. U.S. Pat. No. 7,722,833 discloses other microchannel reactors that are fabricated such that process and heat exchange channel are adjacent to each other. Yet other microchannel reactors use steam reforming, which specifies an alumina catalyst support (U.S. Pat. No.

7,722,854); using W for steam methane reforming (U.S. Pat. No. 7,8291,602); and using a liquid mixture to prepare the catalyst (U.S. Pat. No. 8,100,996).

The multi-microtubular in-situ ALD-based fabrication technique described herein leaps over these technical complications and cost concerns utilizing a simplified technique. Furthermore, the catalytic productivities for the use of conventional catalysts can be improved upon, with the use of a highly-dispersed ALD based nano-Co catalyst, as described herein. The reactors of the present disclosure are a departure from other microtube systems, because exemplary reactors as described herein can be heated using a general heat exchanger configuration with multiple reaction tubes and a single heat exchange fluid flowing around them. This is in contrast to other techniques where heat is supplied at the tube surface which would not be advantageous for highly exothermic reactions such as the reactor disclosed in U.S. Publication No. US2012/0315199, entitled System and Method for Microreactor. This invention is additionally a departure from the previous reference that states use of ALD on an aerogel support whereas this inventions support material is fabricated with ALD of W.

As noted above, various exemplary reactors in accordance with this disclosure provide highly active Co Fischer Tropsch process catalyst using ALD to deposit metallic Co on metallic W support material within microtubes. Advantages of the combination of concepts are summarized in Table 2.

TABLE 2

Summary of benefits of in-situ ALD-
based Co/W FTS microtube reactors

| Concept | Benefit |
| --- | --- |
| Metallic W support | Increased thermal conductivity, radial heat removal from the exothermic FTS reaction |
| Metallic Co ALD | Increased stability of Co particles against oxidation and sintering for longer lifetime |
| Multi-microtube reactor | Increased surface -to-volume ratio, improved heat removal from exothermic FTS reaction |
| In-situ ALD fabrication | Simplified fabrication by liquid and gas phase processing all within the final reactor housing with highly controlled support and catalyst material properties and Co catalyst of higher activity than conventional incipient wetness deposition techniques |

A multi-microtubular reactor (i.e., fixed tube sheet) can be scaled to larger production by simply increasing the number of tubes. The present disclosure provides a catalyst of higher activity, compared to similar Co catalysts, because no reduction of Co is required. Also, the thermally conductive W support chemically attached to the tube wall allows for increased radial heat transport out of the reactor.

An in-situ ALD-based multi-microtubular reactor as described herein provides improved productivity to liquid fuel products from CTL/GTL technologies while improving process economics by limiting byproduct production and increasing process controllability. These are advantages found also for microchannel reactors; however, microchannel reactors have not been an economically feasible option for commercial Fischer Tropsch reactions despite their enhanced performance for exothermic reactions. The reactor fabrication process described herein is a feasible economically viable alternative to microchannel reactors for improved Fischer Tropsch process productivity for liquid fuels.

TABLE 3

Characteristics of new technologies competing
with proposed concept reactor

|  | Microchannel | Monolith | PBR w/Co ALD Catalyst | ALD-based microtube |
| --- | --- | --- | --- | --- |
| Fabrication Complexity | High | High | Low | Low |
| Radial Heat Transport | High | High | Low | High |
| Catalyst | Washcoat-Incipient wetness | Washcoat-Incipient wetness | ALD | ALD |

Turning now to FIG. 5, a reactor 500, including a microtube 502, having an inner wall 504, tungsten 506 deposited onto inner wall 504, and a catalyst 508 deposited onto the tungsten, is illustrated. In the illustrated example, tungsten 506 forms islands on inner wall 504. However, the tungsten may be deposited as a continuous or semi-continuous layer. Similarly, although the catalyst 508 is illustrated as formed in islands, catalyst 508 may be formed as a continuous layer—e.g., on a continuous layer of W. Additionally, although not illustrated, reactor 500 may include a layer of, e.g., aluminum oxide underlying tungsten 506.

An exemplary shell and microtubular reactor can be fabricated by Micro Tube Fabricators (MTF), Inc., Middlesex, N.J. Materials include stainless steel, nickel alloys, or the like, with outside tube diameters down to 0.025" and a wall thickness down to 0.002," i.e., tubes having an inside diameter of 533 µm·as compared to the existing 400 µm channel microchannel reactors. Hence, sizing is comparable. Laser welding can be used for fabricating a reactor system, as illustrated in FIG. 12.

Reactor 500 may be formed by using in-situ ALD deposition of an oxide (optional), in-situ ALD deposition of a tungsten layer (e.g., about 20 to about 200 or about 20 to about 100 ALD cycles of W), and in-situ ALD deposition (e.g., about 1 to about 10 or about 2 to about 5 cycles of deposition) of a catalyst, such as cobalt.

Pressure drop in the tube wall coated reactor systems can be calculated from the Hagen-Poiseuille equation and are less than 0.01 bar/m for capillary tubes of 127 µm internal diameters or larger.

Figure 8:
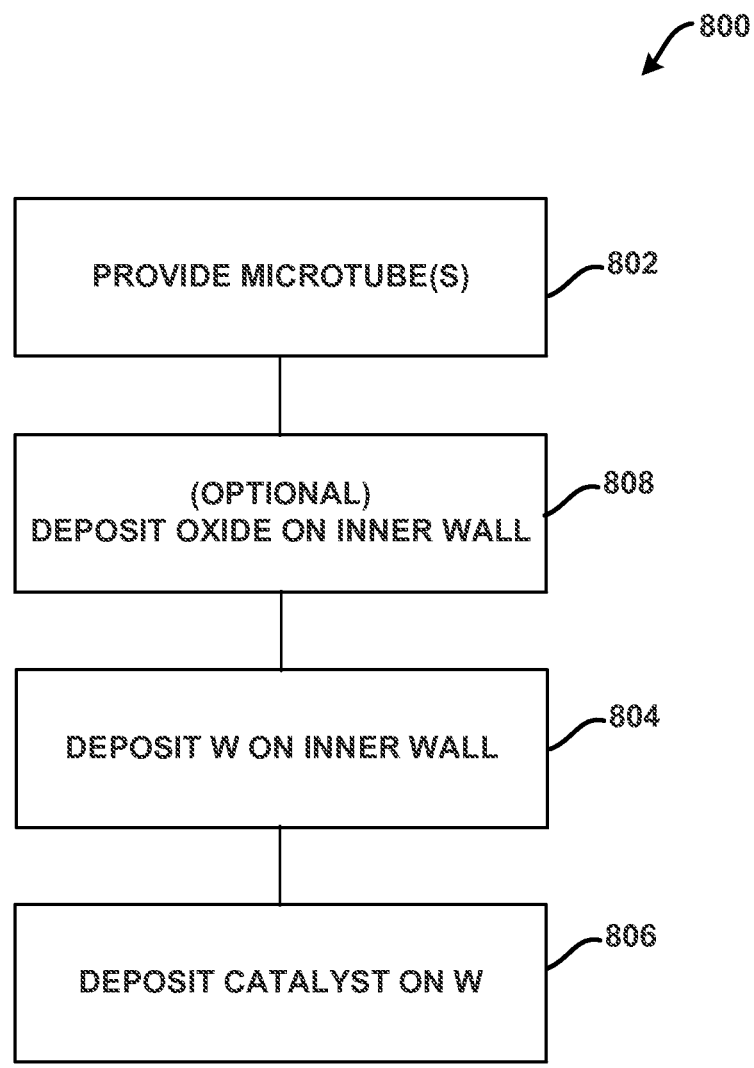
FIGS. 8-10 illustrate methods of forming microtubular reactors in accordance with yet additional exemplary embodiments of the invention.

FIG. 8 illustrates a method 800 of forming a microtubular reactor, such as reactor 500. Method 800 includes the steps of providing one or more microtubes (step 802), depositing tungsten on an inner wall of the one or more microtubes (step 804), depositing catalyst material, such as a metal selected from the group consisting of Co, Ni, NiPt, Rh, Ru, Pd, Os, V, Fe, and Mn onto the tungsten (step 806), and optionally depositing an oxide onto the inner wall prior to the step of depositing tungsten (step 808). The steps of depositing the oxide (optional), depositing W, and depositing catalyst material are performed using in-situ ALD techniques, wherein one or more ALD layers are deposited on the inner wall to form continuous or discontinuous layers (e.g., islands on material) on the inner wall.

FIG. 6 illustrates another microtubular reactor 600 having a porous W and catalyst wall coating 606 on an inner wall 604 of microtube 602. Microtube 602 and wall 604 may be the same as microtube 502 and wall 504 described above. The W and catalyst wall coating can be chemically bound to wall 602 to provide advantages as described herein. Exemplary tubes, which include sacrificial polymer material and that can be welded into another microtube to form reactor 600 are available from Restek, as Siltek®-treated stainless steel PLOT products. Porous wall coated microtube reactor pressure drop can be calculated from the internal void diameter and thus dependent on the porous coat thickness as well as tube diameter.

Figure 9:
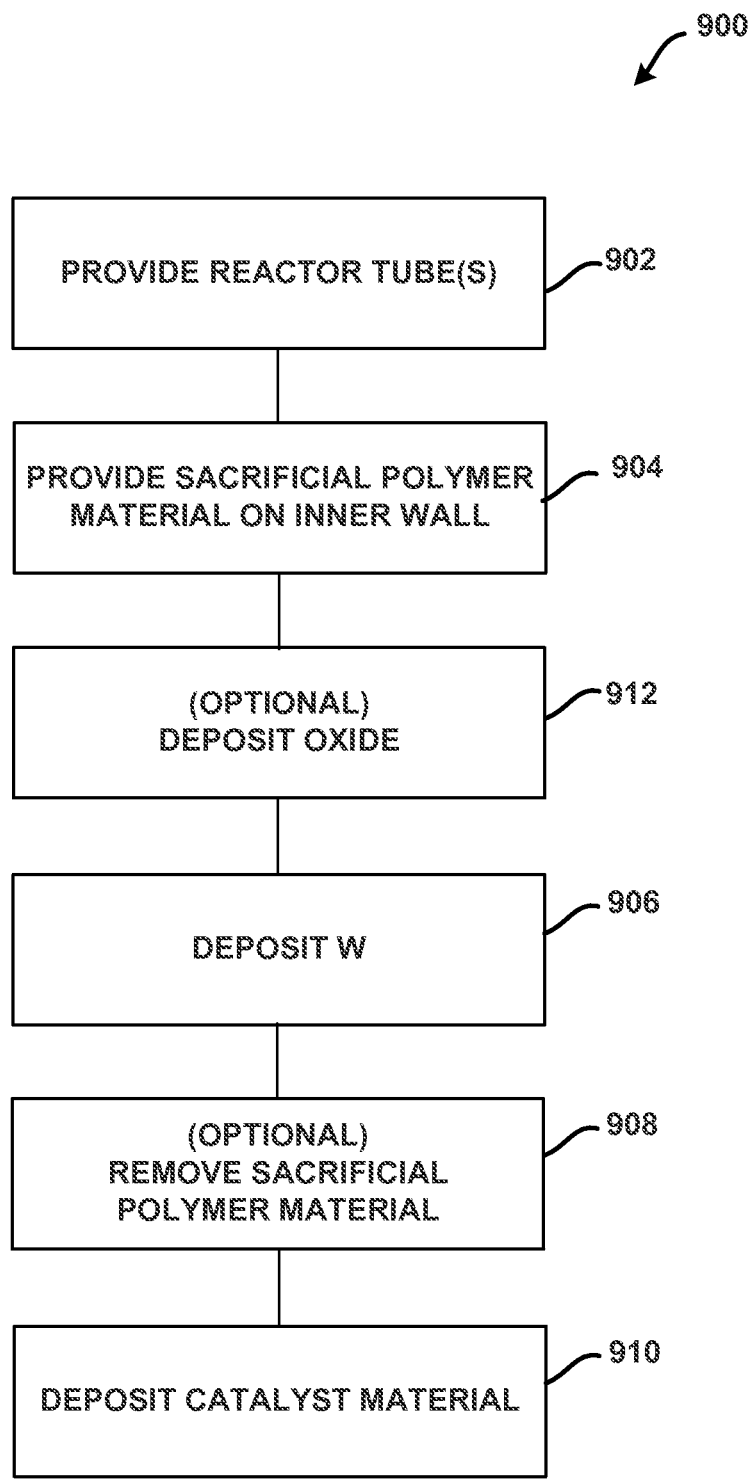

FIG. 9 illustrates a method 900 of forming a reactor, such as reactor 600. Method 900 includes the steps of providing one or more reactor tubes (step 902), providing sacrificial polymer material or structure on an interior surface of the one or more reactor tubes (step 904), depositing tungsten onto the sacrificial polymer material (step 906), optionally removing the sacrificial polymer material or structure to form porous tungsten on the interior surface (step 908), depositing catalyst material, such as one or more metals selected from the group consisting of Co, Ni, NiPt, Rh, Ru, Pd, Os, V, Fe, and Mn onto the porous tungsten (step 910), and optionally depositing an oxide on the polymer material (step 912). The steps of method 900 may be the same or similar to those described above in connection with methods to form a catalyst, except the reactor is formed using in-situ ALD techniques within a microtube.

FIG. 7 illustrates a microtubular reactor 700, including a microtube 702 and a packed bed of porous W material coated with catalyst material 704. Microtube 702 and catalyst coated material/structures may be the same or similar to the tubes and catalyst structures described herein. The catalyst structures may be chemically bonded to an interior wall of microtube 702.

Figure 10:
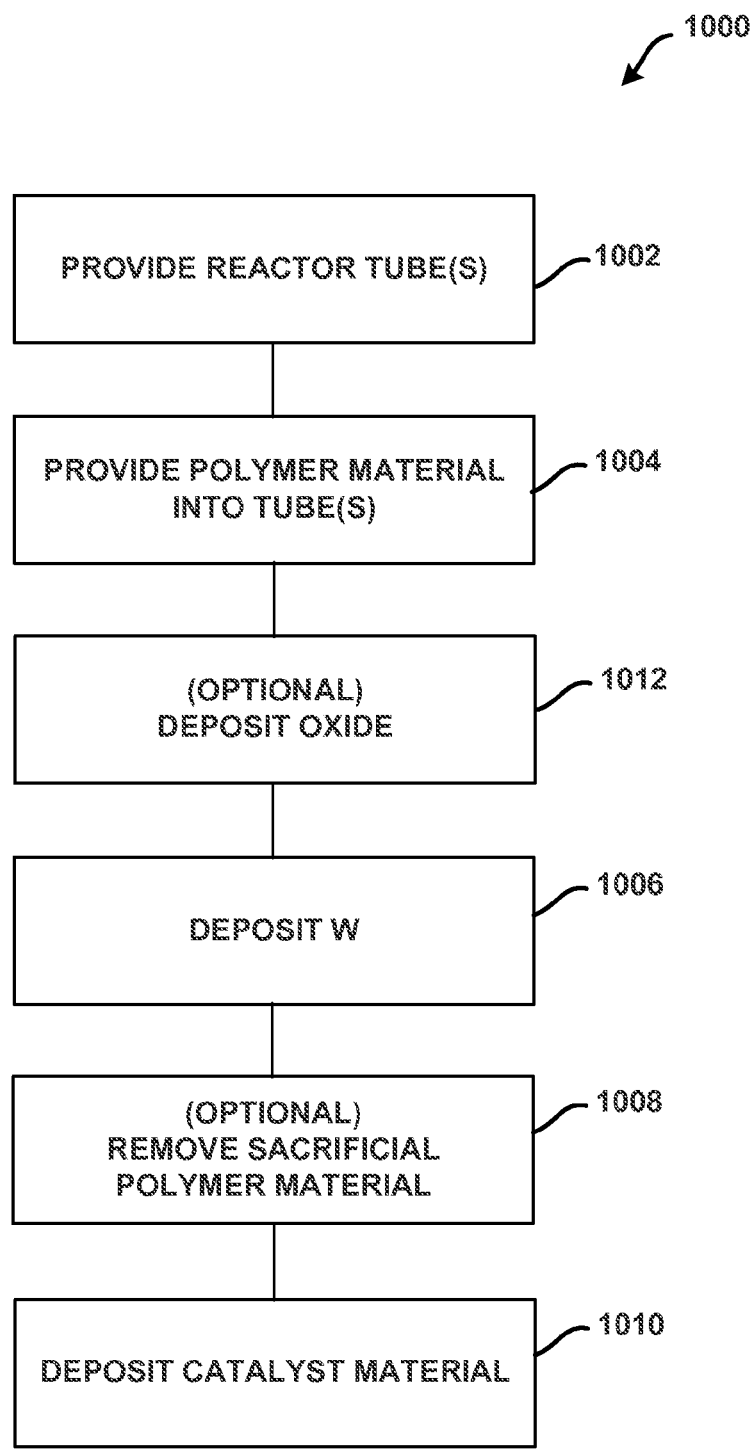

FIG. 10 illustrates a method 1000 of forming a reactor, such as reactor 700. Method 1000 includes the steps of providing one or more reactor tubes (step 1002), packing sacrificial polymer material onto an interior of the one or more reactor tubes (step 1004), depositing tungsten onto the sacrificial polymer material (step 1006), optionally removing the sacrificial polymer material to form porous tungsten on the interior surface (step 1008), depositing catalyst material, such as one or more metals selected from the group consisting of Co, Ni, NiPt, Rh, Ru, Pd, Os, V, Fe, and Mn onto the porous tungsten, and optionally depositing an oxide (Step 1012). Steps 1002-1012 may be the same or similar to steps 902-912, except that step 1002 includes providing a packed bed substrate/template polymer, rather than polymer material attached in an interior wall, as illustrated in FIG. 6. By way of example, the sacrificial polymer material may be obtained from Valco Instruments Co. Inc. under the name HayeSep® porous polymers and may be prepacked into a tube (e.g., a gas chromatography tube having a 1/16" or 1/8" diameter).

Modeling of a packed bed of porous W particles has shown a plausible increase in effective thermal conductivity of over 5× higher than that for a conventional catalyst support. A plot of the theoretical effective thermal conductivity through a randomly packed bed of particles as a function of particle porosity is displayed in FIG. 11(b). The generated structure of the randomly packed bed is shown in FIG. 11(a).

Of the three reactor tube concepts described above, the aspect ratios range from 1:1 for tube wall deposition up about 2000:1 or more, dependent on the porous structure pore length and diameter. Operating conditions can be systematically chosen to reduce cycle times and the overall reactor fabrication time. Exposure times can be performed below half a second for our tubes having as aspect ratio of 2000:1.

FIG. 12 illustrates a system 1200, including a plurality of microtubular reactors 1202, such as reactors 500, 600, and/or 700. Although system 1200 is illustrated with 7microtubular reactors 1202, systems may include any suitable number of microtubular reactors.

As noted above, in addition to cobalt, other catalysts can be deposited onto tungsten supports and can be used in the formation of reactors as described herein. This catalyst synthesis platform is transferrable to other costly metals (Rh, Ru, Pd, Os, V, and the like), as well as more inexpensive catalysts (Ni, Fe, Mn, Co, and the like). Bimetallic/trimetallic compositions that can be customized for tunable commercial products with essentially no precursor waste can also be formed according to the methods described herein.

The data in FIG. 13 depict the activity for the hydrogenation of propylene, which compares a Ni catalyst produced via incipient wetness (1.0 wt %) to that produced using ALD (0.6 wt %). Not only was the activity an order of magnitude larger, but also the product selectivity between methane and propane was tunable with operating temperature. There is a clear value proposition for adoption of this technology by a manufacturer of Ni catalysts, as the performance gains provided by the ALD approach appear to far outweigh the added cost of the volatile Ni precursor relative to Ni salts used for wet impregnation. Additionally when Pt ALD was augmented to the Ni ALD, the high activity was evident again but the selectivity for hydrogenolysis was even higher and the catalyst became more resistant to deactivation via coking.

Bis(cyclopentyldienyl)Nickel and 20% Hydrogen with balance argon can be used to deposit ALD Ni on porous W supports, as described herein. Traditionally, Ni ALD forms conformal NiO films, but the use of $H_2$ can be used to reduce the NiO to Ni. The activity of a 1 cycle Ni ALD catalyst can be an order of magnitude higher than a traditionally prepared (incipient wetness) Ni catalyst for hydrogenation of propylene. The ALD catalyst can also be selective for a hydrogenolysis reaction because of the smaller particle size and size-induced defects, in accordance with theoretical calculations, whereas the traditional catalyst could not catalyze the reaction at all.

Turning now to FIGS. 14 and 15, systems 1400 and 1500 including microtubular reactors, such as reactors 500, 600, and/or 700 are illustrated. With reference to FIG. 14, system 1400 includes a microtubular reactor 1402, a product mixer 1404, a heat exchanger 1406, a two-phase separator 1408, a valve 1410, a three-phase separator 1412, a pump 1414, and a steam cooler 1416. As illustrated, system 1400 can be used to form light syncrude products (e.g., up to about 30 barrels per day) from syngas using a microtubular reactor as described herein. In the illustrated example, heat exchanger 1406 represents the cooling in the flash drum, where the light hydrocarbons are separated out. The products that are dropped out continue on to the final separation column, where the light crude product is collected. Pump 1414 and steam cooler 1416 represent the cooling system that could be used on site for the small scale system. The flare gas stream shown in is not recycling back to the reactor because of the high single pass conversion of 96%. Eliminating a recycle stream preserves the desired small equipment size; cost associated with increasing the equipment size out weights the profit gained from the slightly higher conversions. Additionally, the flare gas flow is significantly smaller after MTR processing of the feed natural gas stream, which would have been flared.

System 1500 includes a microtubular reactor 1502, a product mixer 1504, a heat exchanger 1506, a two-phase separator 1508, a valve 1510, a compressor 1512, and a three-phase separator 1514 to produce light syncrude products (e.g., up to about 20000 barrels per day) from syngas. In the large scale system 1500, an auxiliary cooling unit is not necessary as utilities are available. A second difference between system 1500 and system 1400 is the addition of the compressed light hydrocarbon product shown. This stream is sent to another process to be refined into additional product. Again, the flare gas stream is flared not recycled due to the negligible gains compared to increased cost.

The present invention has been described above with reference to a number of exemplary embodiments and examples. It should be appreciated that the particular embodiments shown and described herein are illustrative of the preferred embodiments of the invention and its best mode, and are not intended to limit the scope of the invention as set forth in the claims. It will be recognized that changes and modifications may be made to the embodiments described herein without departing from the scope of the present invention. These and other changes or modifications are intended to be included within the scope of the present invention, as expressed in the following claims and the legal equivalents thereof

REFERENCES

1. Schulz, H., *Short history and present trends of Fischer-Tropsch synthesis*. Applied Catalysis a-General, 1999. 186(1-2): p. 3-12.
2. Dry, *The Fischer-Tropsch process 1950_2000*. Catalysis Today, 2002.
3. Casci, J. L., C. M. Lok, and M. D. Shannon, *Fischer-Tropsch catalysis: The basis for an emerging industry with origins in the early 20th Century*. Catalysis Today, 2009. 145(1-2): p. 38-44.
4. Puurunen, R. L., *Surface chemistry of atomic layer deposition: A case study for the trimethylaluminum/water process*. Journal of Applied Physics, 2005. 97(12).
5. Puurunen, R. L., *Surface chemistry of atomic layer deposition: A case study for the trimethylaluminum/water process*. Journal of Applied Physics, 2005. 97(12): p. 121301.
6. *Affordable, Low-Carbon Diesel Fuel from Domestic Coal and Biomass*. 2009. DOE/NETL-2009/1349.
7. Madon, R. J., E. Iglesia, and S. C. Reyes, *NON-FLORY PRODUCT DISTRIBUTIONS IN FISCHER-TROPSCH SYNTHESIS CATALYZED BY RUTHENIUM, COBALT, AND IRON*. Acs Symposium Series, 1993. 517: p. 383-396.
8. Iglesia, E., S. L. Soled, and R. A. Fiato, *FISCHER-TROPSCH SYNTHESIS ON COBALT AND RUTHENIUM—METAL DISPERSION AND SUPPORT EFFECTS ON REACTION-RATE AND SELECTIVITY*. Journal of Catalysis, 1992. 137(1): p. 212-224.
9. Cao, C., et al., *Intensified Fischer-Tropsch synthesis process with microchannel catalytic reactors*. Catalysis Today, 2009. 140(3-4): p. 149-156.
10. Borg, O., et al., *Fischer-Tropsch synthesis over γ-alumina-supported cobalt catalysts: Effect of support variables*. Journal of Catalysis, 2007. 248(1): p. 89-100.
11. Saib, A. M., M. Claeys, and E. van Steen, *Silica supported cobalt Fischer-Tropsch catalysts: effect of pore diameter of support*. Catalysis Today, 2002. 71(3-4): p. 395-402.
12. Bezemer, G. L., et al., *Cobalt particle size effects in the Fischer-Tropsch reaction studied with carbon nanofiber supported catalysts*. Journal of the American Chemical Society, 2006. 128(12): p. 3956-3964.
13. Borg, O., et al., *Fischer-Tropsch synthesis: Cobalt particle size and support effects on intrinsic activity and product distribution*. Journal of Catalysis, 2008. 259(2): p. 161-164.
14. Prieto, G., et al., *Cobalt particle size effects in Fischer-Tropsch synthesis: structural and in situ spectroscopic characterisation on reverse micelle-synthesised Co/ITQ-2 model catalysts*. Journal of Catalysis, 2009. 266(1): p. 129-144.
15. Herranz, T., et al., *Influence of the Cobalt Particle Size in the CO Hydrogenation Reaction Studied by In Situ X-Ray Absorption Spectroscopy*. Journal of Physical Chemistry B, 2009. 113(31): p. 10721-10727.
16. Backman, L. B., et al., *A novel Co/SiO2 catalyst for hydrogenation*. Catalysis Today, 1998. 43(1-2): p. 11-19.
17. Backman, L. B., et al., *Effect of support and calcination on the properties of cobalt catalysts prepared by gas phase deposition*. Applied Catalysis a-General, 2000. 191(1-2): p. 55-68.
18. de Deugd, R. M., F. Kapteijn, and J. A. Moulijn, *Using monolithic catalysts for highly selective Fischer-Tropsch synthesis*. Catalysis Today, 2003. 79-80: p. 495-501.
19. Boger, T. and A. K. Heibel, *Heat transfer in conductive monolith structures*. Chemical Engineering Science, 2005. 60(7): p. 1823-1835.
20. Tronconi, E., et al., *Monolithic catalysts with 'high conductivity' honeycomb supports for gas/solid exothermic reactions: characterization of the heat-transfer properties*. Chemical Engineering Science, 2004. 59(22-23): p. 4941-4949.
21. Visconti, C. G., et al., *An experimental investigation of Fischer-Tropsch synthesis over washcoated metallic structured supports*. Applied Catalysis A: General, 2009. 370(1-2): p. 93-101.
22. Liu, W., *Ministructured catalyst bed for gas-liquid-solid multiphase catalytic reaction*. Aiche Journal, 2002. 48(7): p. 1519-1532.
23. Myrstad, R., et al., *Fischer-Tropsch synthesis in a microstructured reactor*. Catalysis Today, 2009. 147: p. S301-S304.
24. Tonkovich, A., et al., *Microchannel Technology Scale-up to Commercial Capacity*. Chemical Engineering Research and Design, 2005. 83(6): p. 634-639.
25. Liang, X. H., S. M. George, and A. W. Weimer, *Synthesis of a novel porous Polymer/Ceramic composite material by low-temperature atomic layer deposition*. Chemistry of Materials, 2007. 19(22): p. 5388-5394.
26. Wilson, C. A., et al., *Tungsten atomic layer deposition on polymers*. Thin Solid Films, 2008. 516(18): p. 6175-6185.
27. Wind, R. W., et al., *Nucleation period, surface roughness, and oscillations in mass gain per cycle during W atomic layer deposition on Al(2)O(3)*. Journal of Applied Physics, 2009. 105(7).
28. Johnson, B. G., C. H. Bartholomew, and D. W. Goodman, *THE ROLE OF SURFACE-STRUCTURE AND DISPERSION IN CO HYDROGENATION ON COBALT* Journal of Catalysis, 1991. 128(1): p. 231-247.
29. Shimizu, H., et al., *Hot-wire-assisted atomic layer deposition of a high quality cobalt film using cobaltocene: Elementary reaction analysis on NHx radical formation*. Journal of Vacuum Science & Technology A, 2012. 30(1).
30. George, S. M., *Atomic Layer Deposition: An Overview*. Chemical Reviews, 2010. 110(1): p. 111-131.
31. Jessensky, O., F. Muller, and U. Gosele, *Self-organized formation of hexagonal pore arrays in anodic alumina*. Applied Physics Letters, 1998. 72(10): p. 1173-1175.
32. Kim, J. Y., et al., *Step coverage modeling of thin films in atomic layer deposition*. Journal of Applied Physics, 2007. 101(7).

33. Ritala, M., et al., *Perfectly conformal TiN and Al2O3 films deposited by atomic layer deposition.* Chemical Vapor Deposition, 1999. 5(1): p. 7-9.

The invention claimed is:

1. A method of forming a microtubular reactor, the method comprising the steps of:
   providing one or more reactor tubes;
   depositing tungsten onto an interior surface of the one or more reactor tubes using atomic layer deposition; and
   depositing one or more metals selected from the group consisting of Co, Ni, NiPt, Rh, Ru, Pd, Os, V, Fe, and Mn to form islands or an incomplete layer of the one or more metals onto the tungsten.

2. The method of forming a microtubular reactor of claim 1, further comprising the steps of:
   providing sacrificial polymer material on an interior surface of the one or more reactor tubes, wherein the step of depositing tungsten comprises depositing tungsten onto the sacrificial polymer material; and
   optionally removing the sacrificial polymer material to form porous tungsten on the interior surface.

3. The method of forming a microtubular reactor of claim 2, wherein the step of removing comprises calcination with ammonia.

4. The method of forming a microtubular reactor of claim 1, the method further comprising the steps of:
   packing sacrificial polymer material onto an interior of the one or more reactor tubes, wherein the step of depositing tungsten comprises depositing tungsten onto the sacrificial polymer material; and
   optionally removing the sacrificial polymer material to form porous tungsten on the interior surface.

5. The method of forming a microtubular reactor of claim 4, wherein the step of removing comprises calcination with ammonia.

6. The method of forming a microtubular reactor of claim 1, wherein the step of depositing tungsten comprises forming islands or a semi-continuous layer of tungsten.

7. The method of forming a microtubular reactor of claim 6, wherein the step of depositing tungsten comprises forming islands of tungsten having an average diameter of about 1 nm to about 20 nm.

8. The method of forming a microtubular reactor of claim 6, wherein the step of depositing tungsten comprises forming islands of tungsten having an average diameter of about 10 nm to about 20 nm.

9. The method of forming a microtubular reactor of claim 6, wherein the step of depositing tungsten comprises forming islands of tungsten having an average diameter of about 2 nm to about 10 nm.

10. The method of forming a microtubular reactor of claim 1, wherein the deposited metal forms islands having an average diameter of about 1 nm to about 20 nm.

11. The method of forming a microtubular reactor of claim 1, wherein the deposited metal forms islands having an average diameter of about 10 nm to about 20 nm.

12. The method of forming a microtubular reactor of claim 1, wherein the deposited metal forms islands having an average diameter of about 2 nm to about 10 nm.

13. The method of forming a microtubular reactor of claim 1, wherein the step of depositing one or more metals comprises depositing cobalt.

14. The method of forming a microtubular reactor of claim 1, wherein the step of depositing one or more metals comprises using cobaltcene.

15. The method of forming a microtubular reactor of claim 1, further comprising the step of exposing the tungsten to a nitrogen environment.

16. The method of forming a microtubular reactor of claim 1, further comprising the step of forming tungsten nitride.

* * * * *